(12) United States Patent
Kim (10) Patent No.: US 8,294,255 B2
(45) Date of Patent: Oct. 23, 2012

(54) SEMICONDUCTOR PACKAGE

(75) Inventor: Kilsoo Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 264 days.

(21) Appl. No.: 12/662,269

(22) Filed: Apr. 8, 2010

(65) Prior Publication Data

US 2010/0295166 A1  Nov. 25, 2010

(30) Foreign Application Priority Data

May 21, 2009  (KR) .................. 10-2009-0044593

(51) Int. Cl.
*H01L 23/48* (2006.01)
(52) U.S. Cl. ................. 257/692; 257/723; 257/E23.169
(58) Field of Classification Search .................. 257/692, 257/723, E23.169
See application file for complete search history.

(56) References Cited

U.S. PATENT DOCUMENTS

| | | | |
|---|---|---|---|
| 6,703,713 B1 * | 3/2004 | Tseng et al. | 257/777 |
| 2003/0064547 A1 | 4/2003 | Akram et al. | |
| 2004/0150088 A1 | 8/2004 | Corisis | |
| 2005/0048806 A1 * | 3/2005 | Li | 439/66 |

FOREIGN PATENT DOCUMENTS

KR  10-2001-0026512  4/2001

* cited by examiner

*Primary Examiner* — Bradley K Smith
*Assistant Examiner* — Timor Karimy
(74) *Attorney, Agent, or Firm* — Harness, Dickey & Pierce, P.L.C.

(57) ABSTRACT

The semiconductor package includes a printed circuit board, a first semiconductor chip, and a second semiconductor chip. The printed circuit board includes a slot. The first semiconductor chip is mounted on the printed circuit board to cover a first part of the slot. The second semiconductor chip is mounted on the printed circuit board to cover a second part of the slot separate from the first part. The first semiconductor chip is substantially coplanar with the second semiconductor chip.

19 Claims, 10 Drawing Sheets

SEMICONDUCTOR PACKAGE

CROSS-REFERENCE TO RELATED APPLICATION(S)

This U.S. non-provisional patent application claims priority under 35 U.S.C. §119 of Korean Patent Application 10-2009-0044593, filed on May 21, 2009, the entire contents of which are hereby incorporated by reference.

BACKGROUND

1. Field

Embodiments of the inventive concept relate to a semiconductor device, for example, to a semiconductor package.

2. Description of the Related Art

In the semiconductor industry, there have been continuous advances in integrated circuit packaging technologies to meet a request for increasing miniaturization and mounting reliability. In the packaging technologies, a Ball Grid Array (BGA) package has recently been introduced. In the BGA package, a printed circuit board is used instead of a general lead frame. Since the printed circuit board includes solder balls on an entire surface opposite to a surface to which semiconductor chips are adhered, the BGA package increases mounting density. Moreover, the BGA package reduces or minimizes an electric signal transmitting passage, since the BGA package is electrically connected to an external circuit by the solder balls.

SUMMARY

Embodiments of the inventive concept provide a high-capacity semiconductor package in which electric characteristics are improved.

According to an embodiment of the inventive concept, a semiconductor package includes a printed circuit board, a first semiconductor chip, and a second semiconductor chip. The printed circuit board includes a slot. The first semiconductor chip is mounted on the printed circuit board to cover a first part of the slot. The second semiconductor chip is mounted on the printed circuit board to cover a second part of the slot separate from the first part. The first semiconductor chip is substantially coplanar with the second semiconductor chip.

In an embodiment of the inventive concept, the first and second semiconductor chips are spaced apart from each other on the slot.

In an embodiment of the inventive concept, the semiconductor package includes first wires. The first and second semiconductor chips include bonding pads, where the bonding pads are provided on lower surfaces of the first and second semiconductor chips and are disposed so as to be exposed by the slot. The printed circuit board includes bond fingers disposed on a lower surface of the printed circuit board so as to be adjacent to the slot. The first wires electrically connect the bonding pads to the bond fingers.

In an embodiment of the inventive concept, each of the first wires electrically connects one of the bonding pads of the first and second semiconductor chips to one of the bond fingers.

In an embodiment of the inventive concept, the first wires are disposed to pass through the slot.

In an embodiment of the inventive concept, the semiconductor package, further includes second wires electrically connecting the bonding pads of the first semiconductor chip to the bonding pads of the second semiconductor chip.

In an embodiment of the inventive concept, the semiconductor package further includes solder balls and conductive wiring. The solder balls are attached under a surface of the printed circuit board opposite that to which the first and second semiconductor chips are adhered. The conductive wiring electrically connects the bond fingers to the solder balls. The first wires and the second wires transmit electric signals from the solder balls to the first and second semiconductor chips.

In an embodiment of the inventive concept, the solder balls include at least one of data input/output pins, an address pin, and a control pin.

In an embodiment of the inventive concept, each of the second wires electrically connects one of the bonding pads of the first semiconductor chip to one of the bonding pads of the second semiconductor chip.

In an embodiment of the inventive concept, the bonding pads include first and second bonding pads. The first bonding pads electrically connect the first semiconductor chip to the second semiconductor chip. The second bonding pads electrically connect the printed circuit board to the first semiconductor chip and electrically connect the printed circuit board to the second semiconductor chip.

In an embodiment of the inventive concept, the semiconductor package further includes pad wirings electrically connecting the first bonding pads to the second bonding pads.

In an embodiment of the inventive concept, at least one of the first and second semiconductor chips includes one or more circuit wires electrically connecting at least two of the bonding pads.

In an embodiment of the inventive concept, the semiconductor package further includes an upper molding layer, a lower molding layer, a slot molding layer and an inter-chip molding layer. The upper molding layer covers the first semiconductor chip and the second semiconductor chip. The lower molding layer covers a lower surface of the printed circuit board. The slot molding layer is interposed between the upper molding layer and the lower molding layer to fill the slot. The inter-chip molding layer fills a space between the first semiconductor chip and the second semiconductor chip and is in contact with the upper molding layer and the slot molding layer.

In an embodiment of the inventive concept, a length of the slot molding layer is longer than that of the inter-chip molding layer.

In an embodiment of the inventive concept, the length of the slot molding layer is equal to that of the slot, and the length of the inter-chip molding layer is equal to that of at least one of the first and second semiconductor chips.

In an embodiment of the inventive concept, a length of the slot molding layer is shorter than that of the inter-chip molding layer.

In an embodiment of the inventive concept, the semiconductor package includes a third semiconductor chip mounted on the first semiconductor chip and a fourth semiconductor chip mounted on the second semiconductor chip.

In an embodiment of the inventive concept, the third semiconductor chip and the fourth semiconductor chip cover a part of the slot. A width between the third semiconductor chip and the fourth semiconductor chip is narrower than a width between the first semiconductor chip and the second semiconductor chip.

In an embodiment of the inventive concept, a part of the first semiconductor chip and a part of the second semiconductor chip are exposed through the slot.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Embodiments of the inventive concept will be described below in more detail with reference to the accompanying drawings such that those skilled in the art easily practice the scope of the inventive concept. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of embodiments of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict embodiments of the inventive concept and should not be interpreted to limit the intended scope of the claims. The accompanying figures are not to be considered as drawn to scale unless explicitly noted.

The terminology used herein is for the purpose of describing particular embodiments only and is not intended to be limiting of embodiments of the inventive concept. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Embodiments of the inventive concept are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of embodiments of the inventive concept.

Unless otherwise defined, all terms (including technical and scientific terms) used herein have the same meaning as commonly understood by one of ordinary skill in the art to which embodiments of the inventive concept belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

When it is determined that a detailed description related to a related known function or configuration may make the purpose of embodiments of the inventive concept unnecessarily ambiguous, the detailed description thereof will be omitted. Also, terms used herein are defined to appropriately describe embodiments of the inventive concept and thus may be changed depending on a user, the intent of an operator, or a custom. Accordingly, the terms must be defined based on the following overall description within this specification.

Figure 1:
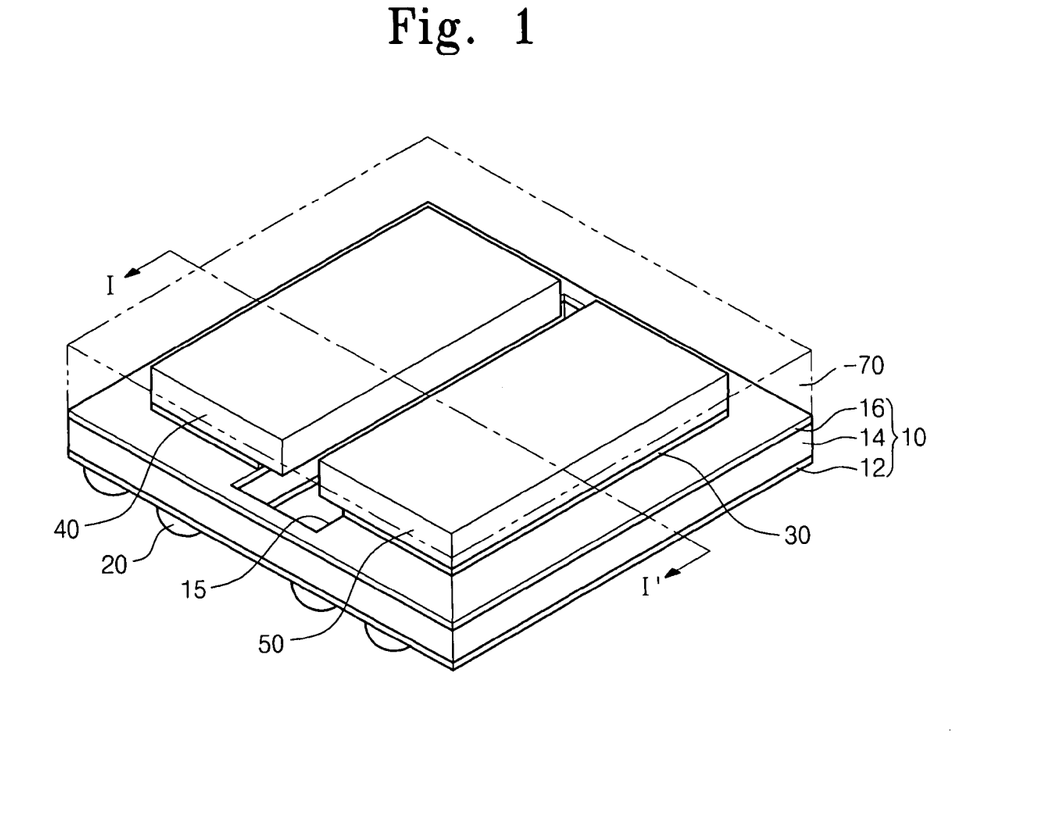
FIG. 1 is a perspective view schematically illustrating a semiconductor package according to an embodiment of the inventive concept.

FIG. 1 is a perspective view schematically illustrating a semiconductor package according to an embodiment of the inventive concept.

Referring to FIG. 1, a printed circuit board 10 having the slot 15 is provided. The slot 15 is disposed at the center of the printed circuit board 10. A first semiconductor chip 40 is mounted on the printed circuit board 10 to cover a part of the slot 15. A second semiconductor chip 50 is mounted on the printed circuit board 10 to cover another part of the slot 15. The first semiconductor chip 40 is substantially coplanar with the second semiconductor chip 50. As shown in FIG. 1, the first semiconductor chip 40 and the second semiconductor chip 50 reside in the same plane, which is parallel to a plane in which the printed circuit board 10 resides.

The first semiconductor chip 40 and the second semiconductor chip 50 are spaced apart from each other on the slot 15. Each of the first semiconductor chip 40 and the second semiconductor chip 50 may be mounted on the printed circuit board 10 by an adhesive layer 30. The first semiconductor chip 40 and the second semiconductor chip 50 may be covered with a molding layer 70. The molding layer 70 may contain an epoxy molding compound (EMC).

The printed circuit board 10 may include a lower insulating layer 12, a core material layer 14, and an upper insulating layer 16. The lower insulating layer 12 and the upper insulating layer 16 may each include a photo solder resist (PSR). Solder balls 20 may be attached to the lower insulating layer 12 of the printed circuit board 10. The solder ball 20 may be electrically connected to a conductive wiring provided on the printed circuit board 10.

A plurality of semiconductor chips may be mounted on the printed circuit board 10 to realize a high-capacity semiconductor package. Moreover, a plurality of semiconductor chips may be coplanar to each other to prevent the thickness of a semiconductor package from being increased.

The above embodiment of the inventive concept only illustrates an example in which the plurality of semiconductor chips are mounted to have coplanarity. Embodiments of the inventive concept are not limited thereto, and may, for example, include three or more semiconductor chips coplanar to each other.

When semiconductor chips are simply stacked in order to realize the high-capacity semiconductor package, the semiconductor may become thicker as the thickness of chips and adhesive layers increase. Moreover, package parasitics may occur due to a via disposed on the printed circuit board.

Figure 2:
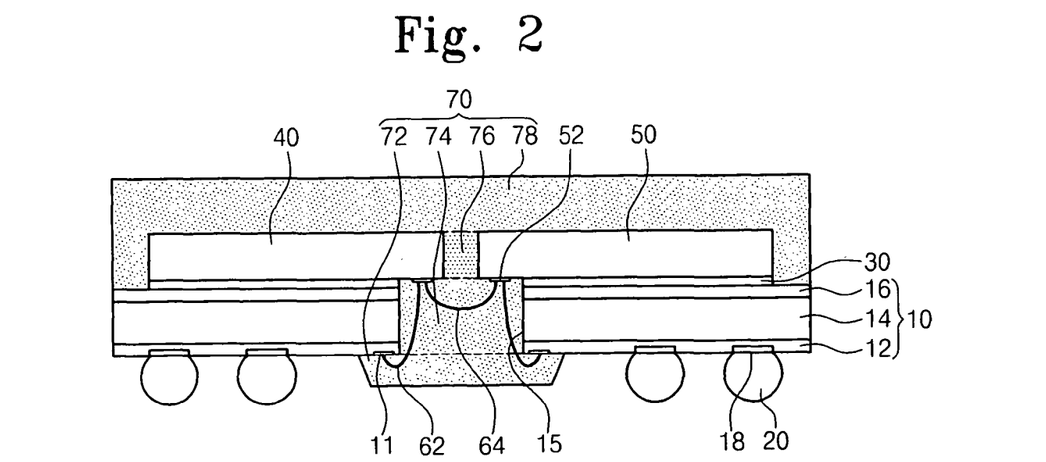
FIG. 2 is a sectional view taken along the line I-I' of FIG. 1.
Figure 3:
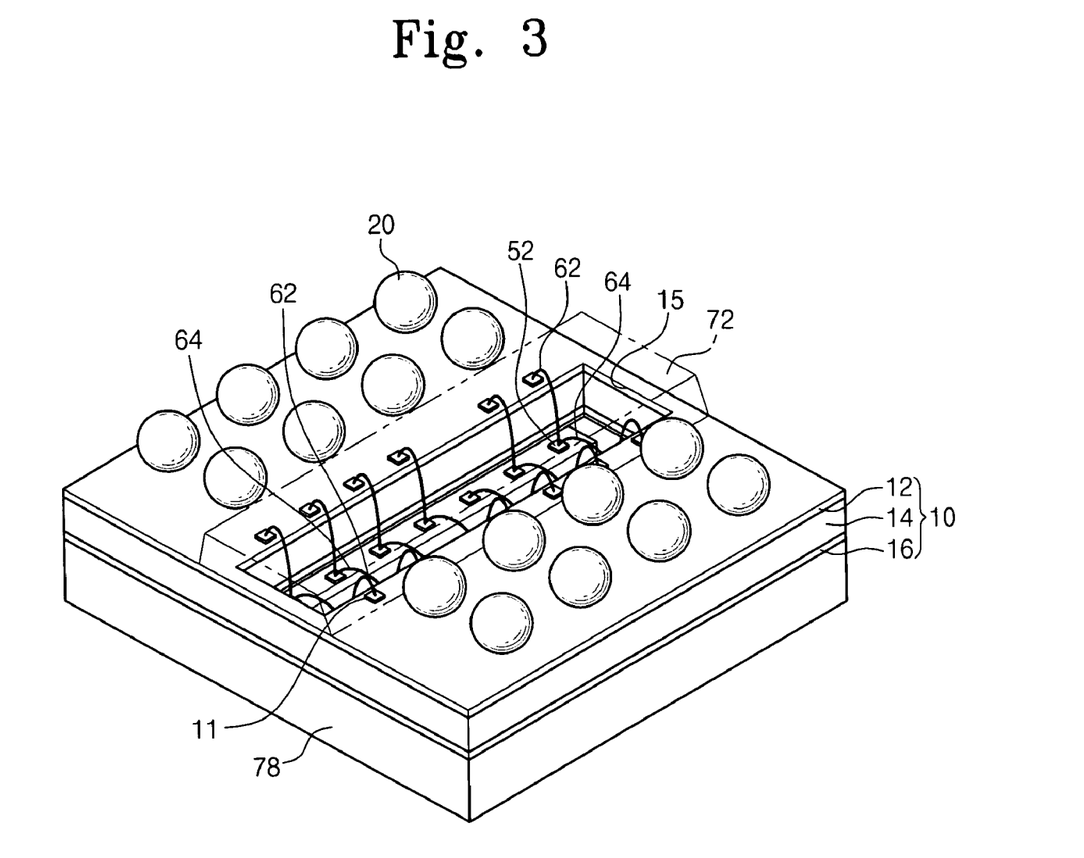
FIG. 3 is a bottom perspective view of FIG. 1.

FIGS. 2 and 3 are diagrams illustrating the semiconductor package in detail according to an embodiment of the inventive concept. FIG. 2 is a sectional view taken along the line I-I' of FIG. 1. FIG. 3 is a bottom perspective view of FIG. 1.

Referring FIGS. 2 and 3, the first semiconductor 40 and the second semiconductor chip 50 are mounted on the printed circuit board 10 having the slot 15 which is disposed at the center thereof. Each of the first semiconductor 40 and the second semiconductor chip 50 may be mounted on the printed circuit board 10 by the adhesive layer 30. The printed circuit board 10 may include the lower insulating layer 12, the core material layer 14, and the upper insulating layer 16. The lower insulating layer 12 and the upper insulating layer 16 may each include the photo solder resist (PSR).

Ball lands 18 and bond fingers 11 may be disposed on the lower insulating layer 12 of the printed circuit board 10. The bond fingers 11 may be disposed adjacent to the slot 15. Each of the solder balls 20 may be attached to each of the ball lands 18.

Bonding pads 52 may be disposed on lower surfaces of the first semiconductor chip 40 and the second semiconductor chip 50. The bonding fads 52 may be disposed so as to be exposed through the slot 15. The bonding pads 52 and the bond fingers 11 may be electrically connected to each other by first wires 62, respectively. Each of the bonding pads 52 may be connected to each of the bond fingers 11 by the first wires 62 passing through the slot 15.

The bonding pads 52 of the first semiconductor chip 40 and the bonding pads 52 of the second semiconductor chip 50 may be electrically connected to each other by second wires 64, respectively. The first wires 62 and the second wires 64 may transmit electric signals from the solder balls 20 (or to the solder balls 20) to the first semiconductor chip 40 and the second semiconductor chip 50.

The semiconductor package according to an embodiment of the inventive concept may include the molding layer 70. The molding layer 70 may contain an epoxy molding compound (EMC). The molding layer 70 may include an upper molding layer 78 covering the first semiconductor 40 and the second semiconductor chip 50, a lower molding layer 72 covering the lower surface of the printed circuit board 10, a slot molding layer 74 being interposed between the upper molding layer 78 and the lower molding layer 72 and filling the slot 15, and an inter-chip molding layer 76 filling the space between the first semiconductor 40 and the second semiconductor chip 50. For example, the inter-chip molding layer 76 may be formed in the space between the first semiconductor 40 and the second semiconductor chip 50.

Figure 4:
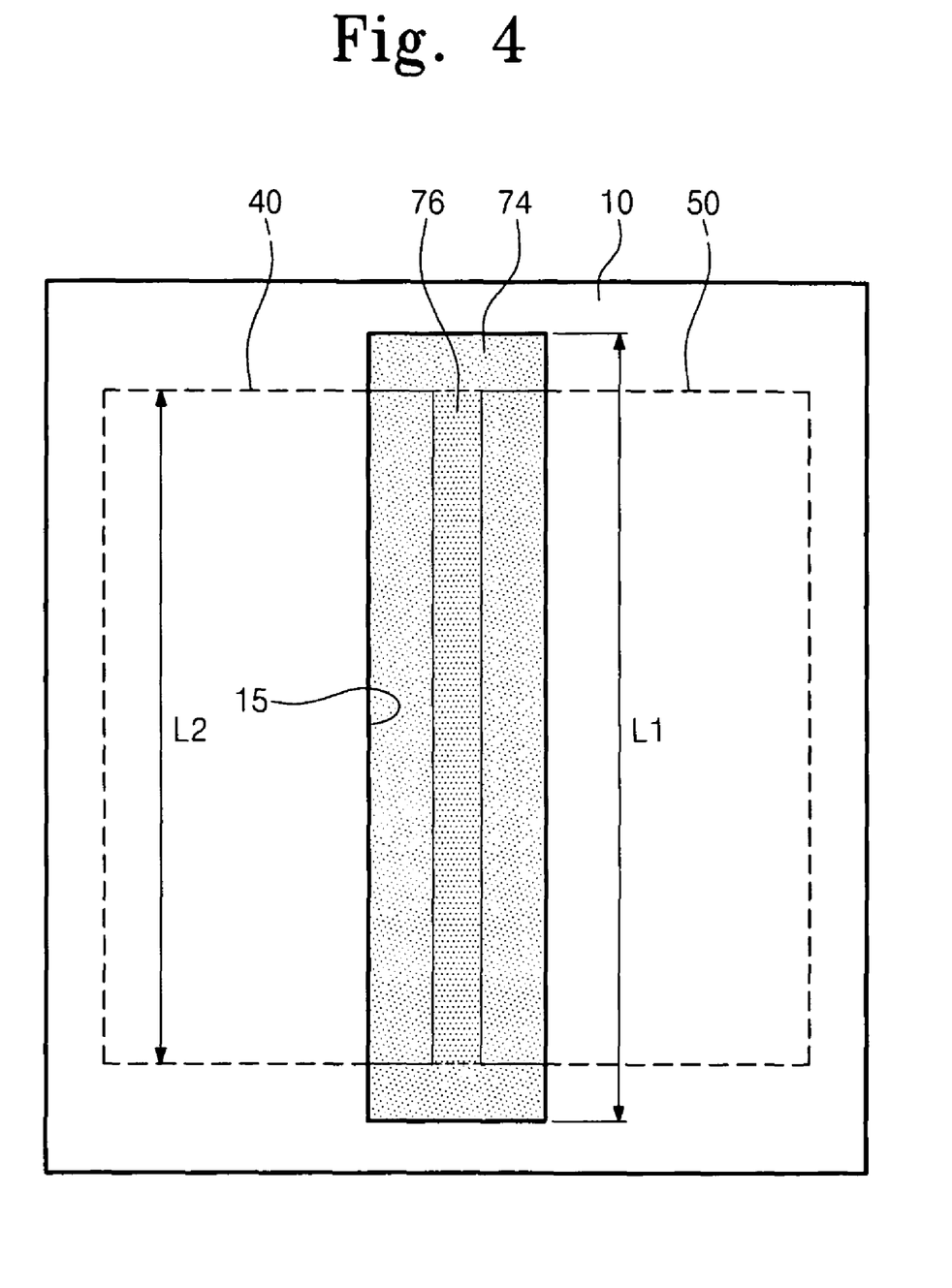
FIG. 4 is a schematic view illustrating molding layers of the semiconductor package according to an embodiment of the inventive concept.

FIG. 4 is a schematic view illustrating the molding layers of the semiconductor package according to an embodiment of the inventive concept.

Referring to FIGS. 2 and 4, the slot molding layer 74 is provided to fill the slot 15 of the printed circuit board 10. The inter-chip molding layer 76 is provided in the space between the first semiconductor 40 and the second semiconductor chip 50.

According to an embodiment of the inventive concept, the length L1 of the slot molding layer 74 may be longer than the length L2 of the inter-chip molding layer 76. The length L1 of the slot molding layer 74 may be equal to the length of the slot 15. The length L2 of the inter-chip molding layer 76 may be equal to the length of the first semiconductor chip 40 or the second semiconductor chip 50.

A mold compound may flow into the slot 15 and the space between the first semiconductor chip 40 and the second semiconductor 50 to form the molding layer 70. The slot molding layer 74 may come into contact with the upper molding layer 72 and the lower molding layer 78, thereby preventing delamination of the molding layer 70. Moreover, since the inter-chip molding layer 76 comes into contact with the upper molding layer 72 and the slot molding layer 74, the inter-chip molding layer 76 may execute the same function (e.g. preventing delamination) as that of the slot molding layer 74.

Figure 5:
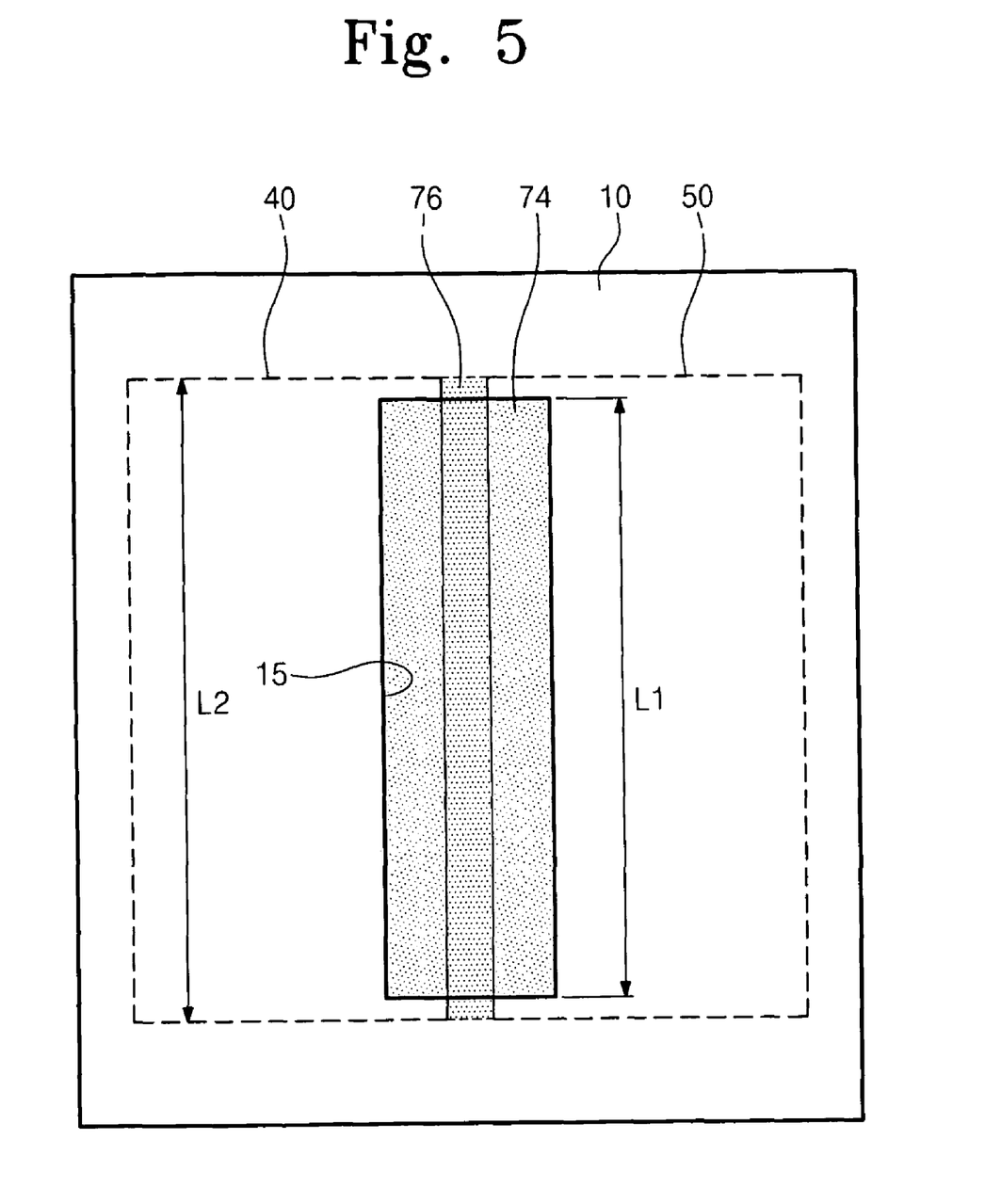
FIG. 5 is a schematic view illustrating molding layers of a semiconductor package according to another embodiment of the inventive concept.

FIG. 5 is a schematic view illustrating molding layers of a semiconductor package according to another embodiment of the inventive concept.

Referring to FIGS. 2 and 5, the slot molding layer 74 is provided to fill the slot 15 of the printed circuit board 10. The inter-chip molding layer 76 is provided in the space between the first semiconductor 40 and the second semiconductor chip 50.

According to another embodiment of the inventive concept, the length L1 of the slot molding layer 74 may be shorter than the length L2 of the inter-chip molding layer 76. The length L1 of the slot molding layer 74 may be equal to the length of the slot 15. The length L2 of the inter-chip molding layer 76 may be equal to the length of the first semiconductor chip 40 or the second semiconductor chip 50.

A mold compound may flow into the space between the first semiconductor chip 40 and the second semiconductor 50 to form the molding layer 70. The inter-chip molding layer 76 comes into contact with the upper molding layer 72 and the slot molding layer 74, thereby preventing the delamination of the molding layer 70 of the semiconductor package.

Figure 6:
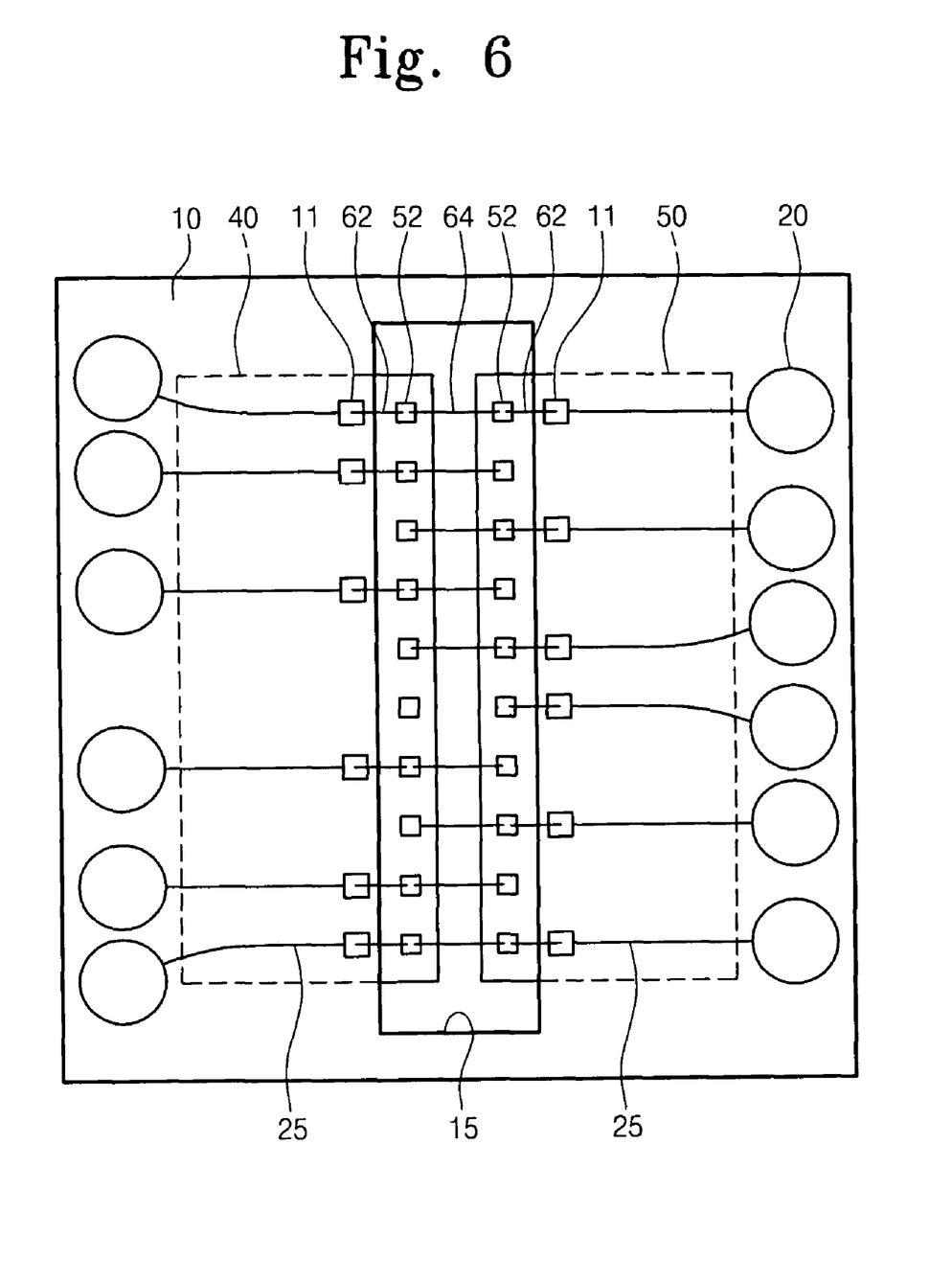
FIG. 6 is a bottom view illustrating bonding pads and wires of the semiconductor package according to an embodiment of the inventive concept.

FIG. 6 is a bottom view illustrating the bonding pads and the wires of the semiconductor package according to an embodiment of the inventive concept.

Referring to FIGS. 2 and 6, the first semiconductor chip 40 and the second semiconductor chip 50 are mounted on the printed circuit board 10 including the slot 15. The first semiconductor chip 40 and the second semiconductor chip 50 may include bonding pads 52, respectively. The printed circuit board 10 may have bond fingers 11. The bonding pads 52 and the bond fingers 11 may be electrically connected to each other by the first wires 62, respectively. The first wires 62 may be disposed so as to pass through the slot 15. The bonding pads 52 of the first semiconductor chip 40 may be electrically connected to the bonding pads 52 of the second semiconductor chip 50 by second wires 64, respectively.

The solder balls 20 may be attached to the lower surface of the printed circuit board 10. The bond fingers 11 may be electrically connected to by the solder balls 20 by the conductive wiring 25. The solder balls 20 may include various kinds of pins such as data input/output pins, an address pin, and a control pin.

According to the embodiment of the inventive concept, the bonding pads 52 of the first semiconductor chip 40 and the second semiconductor chip 50 may be electrically connected to the bond fingers 11 of the printed circuit board 10 through the slot 15.

Figure 7:
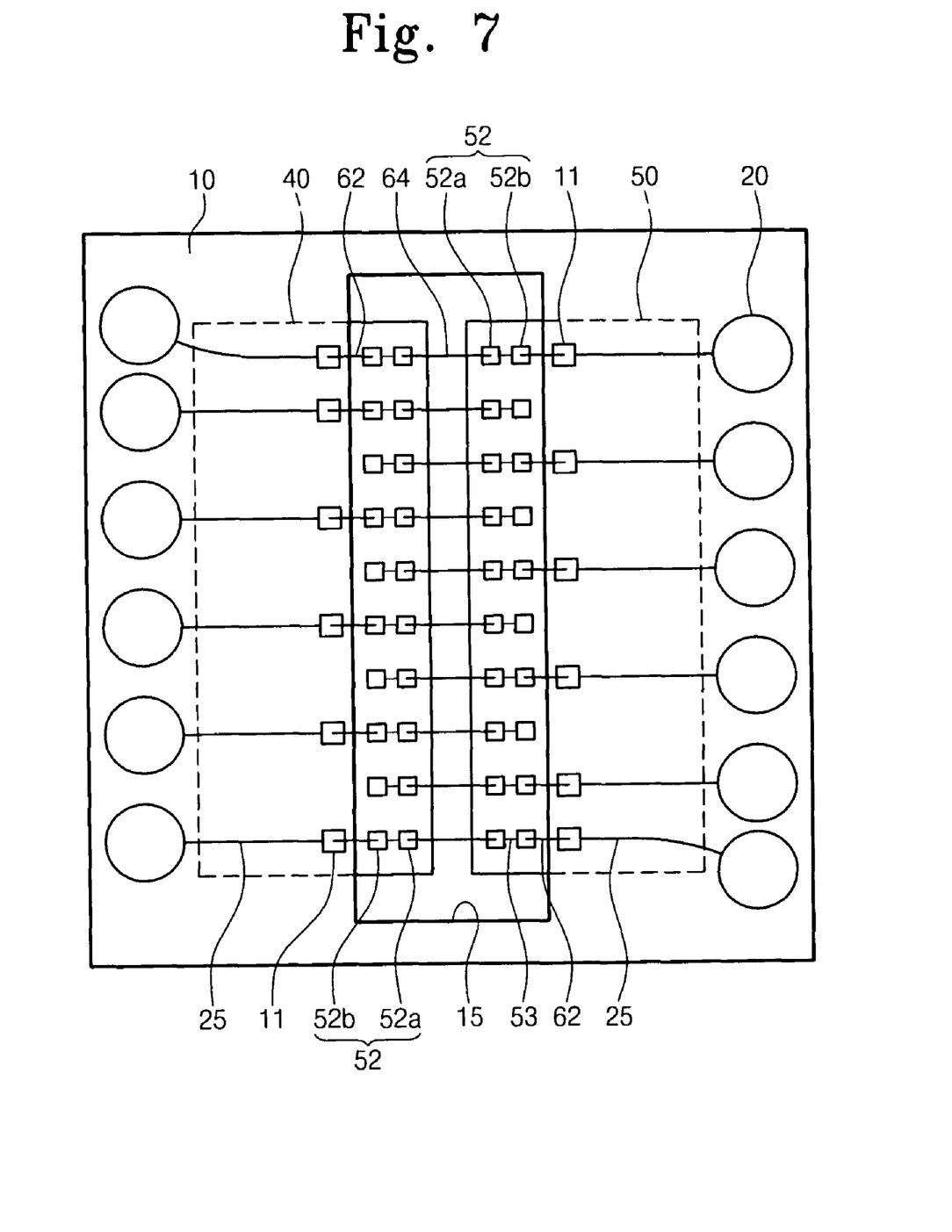
FIG. 7 is a bottom view illustrating bonding pads and wires of the semiconductor package according to another embodiment of the inventive concept.

FIG. 7 is a bottom view illustrating bonding pads and wires of the semiconductor package according to another embodiment of the inventive concept.

Referring to FIGS. 2 and 7, the first semiconductor chip 40 and the second semiconductor chip 50 are mounted on the printed circuit board 10 including the slot 15. The first semiconductor chip 40 and the second semiconductor chip 50 may include bonding pads 52, respectively. The bonding pads 52 may include first bonding pads 52a electrically connecting the first semiconductor chip 40 to the second semiconductor chip 50 and second bonding pads 52b electrically connecting the printed circuit board 10 to the first semiconductor chip 40 and electrically connecting the printed circuit board 10 to the second semiconductor chip 50. The first semiconductor chip 40 and the second semiconductor chip 50 may include pad wirings 53 electrically connecting the first bonding pads 52a to the second bonding pads 52b.

The printed circuit board 10 may include bond fingers 11. The bonding pads 52b and the bond fingers 11 may be electrically connected to each other by first wires 62. The first wires 62 may be disposed so as to pass through the slot 15. The first bonding pads 52a of the first semiconductor chip 40 may be electrically connected to the first bonding pads 52a of the second semiconductor chip 50 by second wires 64.

The solder balls 20 may be attached to the lower surface of the printed circuit board 10. The bond fingers 11 may be electrically connected to the solder balls 20 by the conductive wiring 25. The solder balls 20 may include various kinds of pins such as data input/output pins, an address pin, and a control pin.

According to another embodiment of the inventive concept, the bonding pads 52b of the first semiconductor chip 40 may be electrically connected to the second semiconductor 50 and the bond fingers 11 of the printed circuit board 10 through the slot 15.

By providing the first bonding pads 52a and the second bonding pads 52b, one wire may be bonded to one bonding pad. Accordingly, reliability of the bonding may be improved in the semiconductor package.

Figure 8:
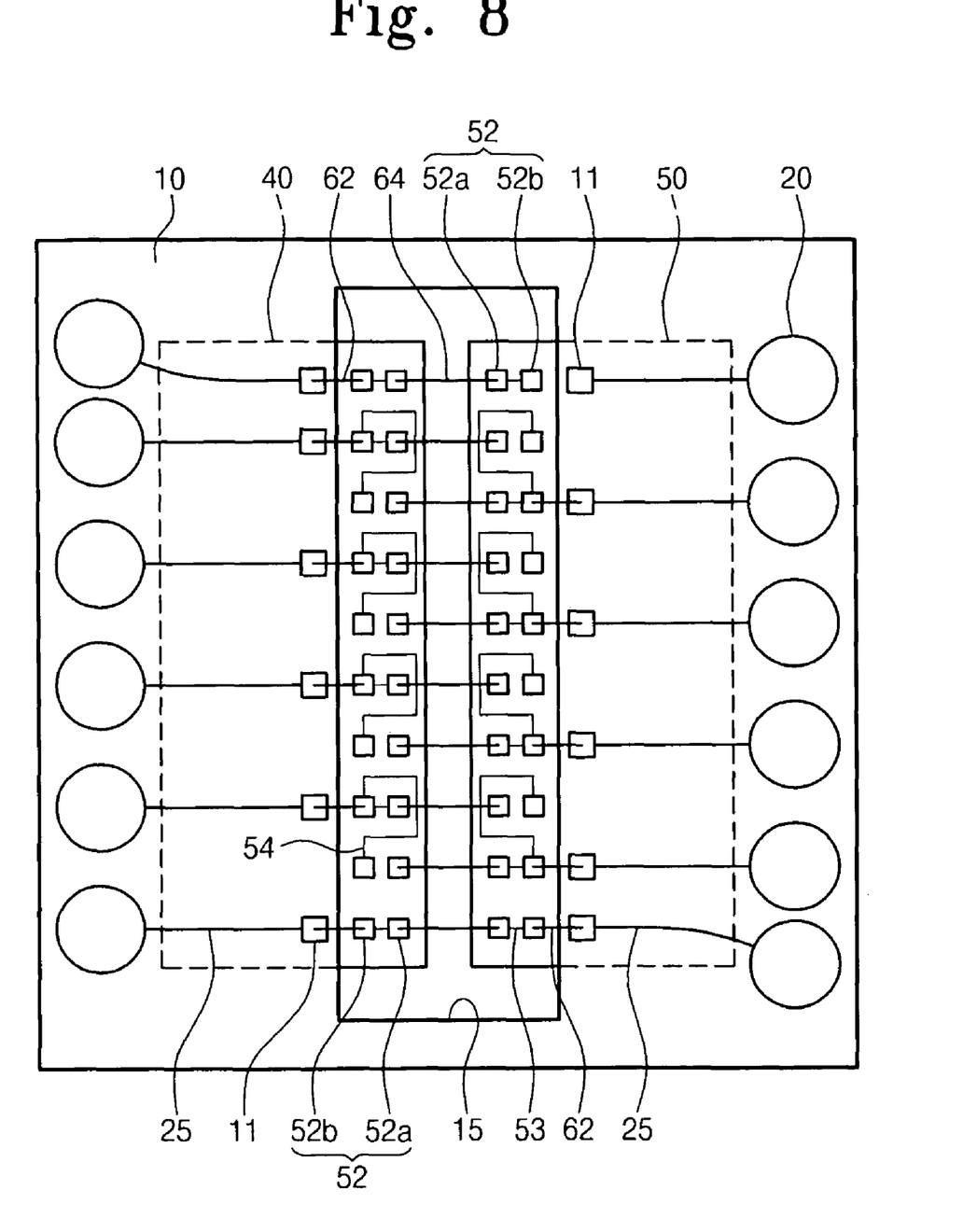
FIG. 8 is a bottom view illustrating bonding pads and wires of a semiconductor package according to still another embodiment of the inventive concept.

FIG. 8 is a bottom view illustrating bonding pads and wires of a semiconductor package according to still another embodiment of the inventive concept.

Referring to FIGS. 2 and 8, the first semiconductor chip 40 and the second semiconductor chip 50 are mounted on the printed circuit board 10 including the slot 15. The first semiconductor chip 40 and the second semiconductor chip 50 may include bonding pads 52, respectively. The bonding pads 52 may include first bonding pads 52a electrically connecting the first semiconductor chip 40 to the second semiconductor chip 50 and second bonding pads 52b electrically connecting the printed circuit board 10 to the first semiconductor chip 40 and electrically connecting the printed circuit board 10 to the second semiconductor chip 50. The first semiconductor chip 40 and the second semiconductor chip 50 may include pad wirings 53 electrically connecting the first bonding pads 52a to the second bonding pads 52b, respectively.

The printed circuit board 10 may include bond fingers 11. The bonding pads 52b and the bond fingers 11 may be electrically connected to each other by first wires 62. The first wires 62 may be disposed so as to pass through the slot 15. The first bonding pads 52a of the first semiconductor chip 40 may be electrically connected to the first bonding pads 52a of the second semiconductor chip 50 by second wires 64.

On the other hand, circuit wirings 54 may be disposed on the lower surfaces of the first and second semiconductor chips 40 and 50 to electrically connect the second bonding pads 52b. The circuit wirings 54 may minimize occurrence of signal skew due to the second wires 64. Thus, the circuit wirings 54 may compensate the signal skew occurring due to the length of the second wires 64.

The solder balls 20 may be attached to the lower surface of the printed circuit board 10. The bond fingers 11 may be electrically connected to the solder balls 20 by the conductive wiring 25. The solder balls 20 may include various kinds of pins such as data input/output pins, an address pin, and a control pin.

According to still another embodiment of the inventive concept, the bonding pads 52b of the first semiconductor chip 40 may be electrically connected to the second semiconductor 50 and the bond fingers 11 of the printed circuit board 10 through the slot 15.

By providing the first bonding pads 52a and the second bonding pads 52b, one wire may be bonded to one bonding pad. Accordingly, reliability of the bonding may be improved in the semiconductor package.

On the other hand, the circuit wiring 54 can compensate the signal skew occurring due to the length of wires between the semiconductor chips.

Figure 9:
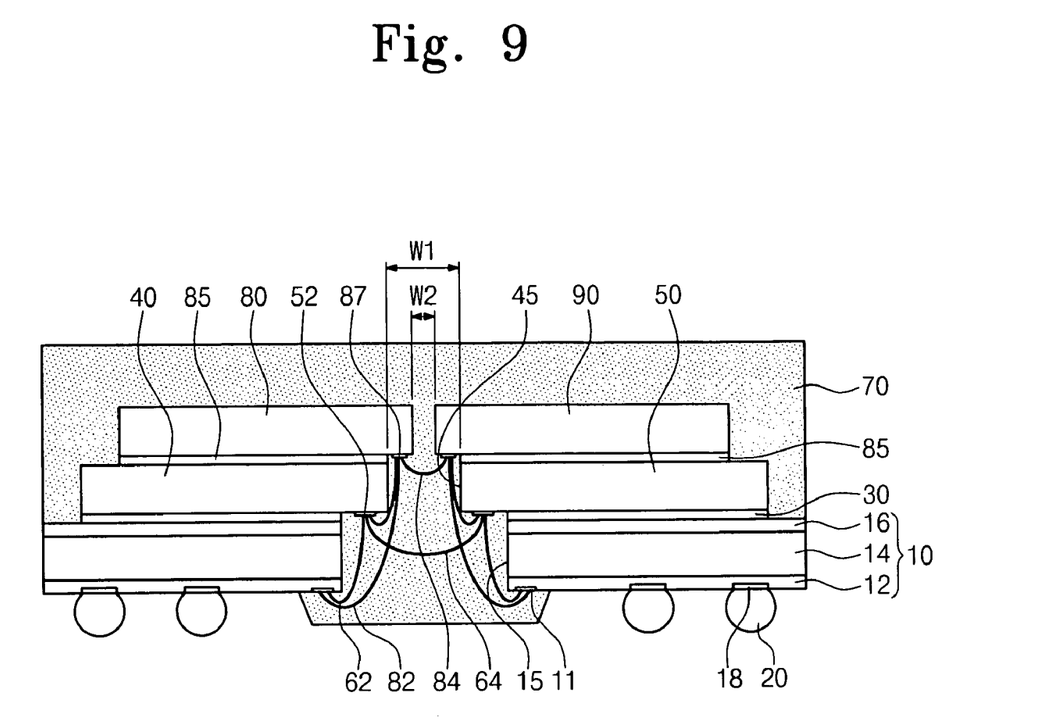
FIG. 9 is a sectional view illustrating the semiconductor package according to another embodiment of the inventive concept.

FIG. 9 is a sectional view illustrating the semiconductor package according to another embodiment of the inventive concept.

Referring to FIG. 9, the printed circuit board 10 including the slot 15 is provided. The slot 15 is disposed at the center of the printed circuit board 10. A first semiconductor chip 40 is mounted on the printed circuit board 10 to cover a part of the slot 15. A second semiconductor chip 50 is mounted on the printed circuit board 10 to cover another part of the slot 15. The first semiconductor chip 40 is substantially coplanar with the second semiconductor chip 50. The first semiconductor chip 40 and the second semiconductor chip 50 may be spaced apart from each other on the slot 15. For example, a part of the first semiconductor chip 40 and a part of the second semiconductor chip 50 may be exposed through the slot 15.

A third semiconductor 80 is mounted on the first semiconductor chip 40. A fourth semiconductor chip 90 is mounted on the second semiconductor chip 50. Each of the third semiconductor chip 80 and the fourth semiconductor chip 90 may be mounted on the printed circuit board 10 by an adhesive layer 85. The third semiconductor chip 80 and the fourth semiconductor chip 90 may each cover a part of an inter-chip gap 45. The width W2 between the third semiconductor chip 80 and the fourth semiconductor chip 90 may be smaller than the width W1 between the first semiconductor chip 40 and the second semiconductor chip 50. The width W1 between the first semiconductor chip 40 and the second semiconductor chip 50 refers to the inter-chip gap 45.

Ball lands 18 and bond fingers 11 may be disposed on the lower insulating layer 12 of the printed circuit board 10. The bond fingers 11 may be disposed adjacent to the slot 15. Each of the solder balls 20 may be attached to each of the ball lands 18.

First bonding pads 52 may be disposed on the lower surfaces of the first semiconductor chip 40 and the second semiconductor chip 50, respectively. The first bonding pads 52 may be disposed so as to be exposed by the slot 15. The first bonding pads 52 and the bond fingers 11 may be electrically connected to each other by first wires 62. The first bonding pads 52 of the first semiconductor chip 40 may be electrically connected to the first bonding pads 52 of the second semiconductor chip 50 by second wires 64. The first wires 62 and the second wires 64 may transmit electrical signals from the solder balls 20 (or to the solder balls 20) to the first semiconductor chip 40 and the second semiconductor chip 50.

Second bonding pads 87 may be disposed on the lower surfaces of the third semiconductor chip 80 and the fourth semiconductor chip 90, respectively. The second bond pads 87 may be disposed so as to be exposed by the inter-chip gap 45. The second bonding pads 87 and the bond fingers 11 may be electrically connected to each other by third wires 82. The second bonding pads 87 of the third semiconductor chip 80 may be electrically connected to the second bonding pads 87 of the fourth semiconductor chip 90 by fourth wires 84. The third wires 82 and the fourth wires 84 may transmit electric signals from the solder balls 20 (to the solder balls 20) to the third semiconductor chip 80 and the fourth semiconductor chip 90.

A molding layer 70 may be disposed to cover the first semiconductor chip 40, the second semiconductor chip 50, the third semiconductor chip 80, and the fourth semiconductor chip 90. The molding layer 70 may contain an epoxy molding compound (EMC). The printed circuit board 10 may include a lower insulating layer 12, a core material layer 14, and an upper insulating layer 16. The lower insulating layer 12 and the upper insulating layer 16 may each include a photo solder resist (PSR). The solder balls 20 may be attached to the lower insulating layer 12 of the printed circuit board 10.

By mounting the plurality of semiconductor chips on the printed circuit board 10, it is possible to realize the high-capacity semiconductor package. Moreover, since the plurality of semiconductor chips are disposed and stacked to have coplanarity, it can possible to prevent the thickness of the semiconductor package from being increased. However, embodiments are not limited thereto, and may include the semiconductor chips stacked in three or more layers, which may be used in a system requiring high capacity.

Figure 10:
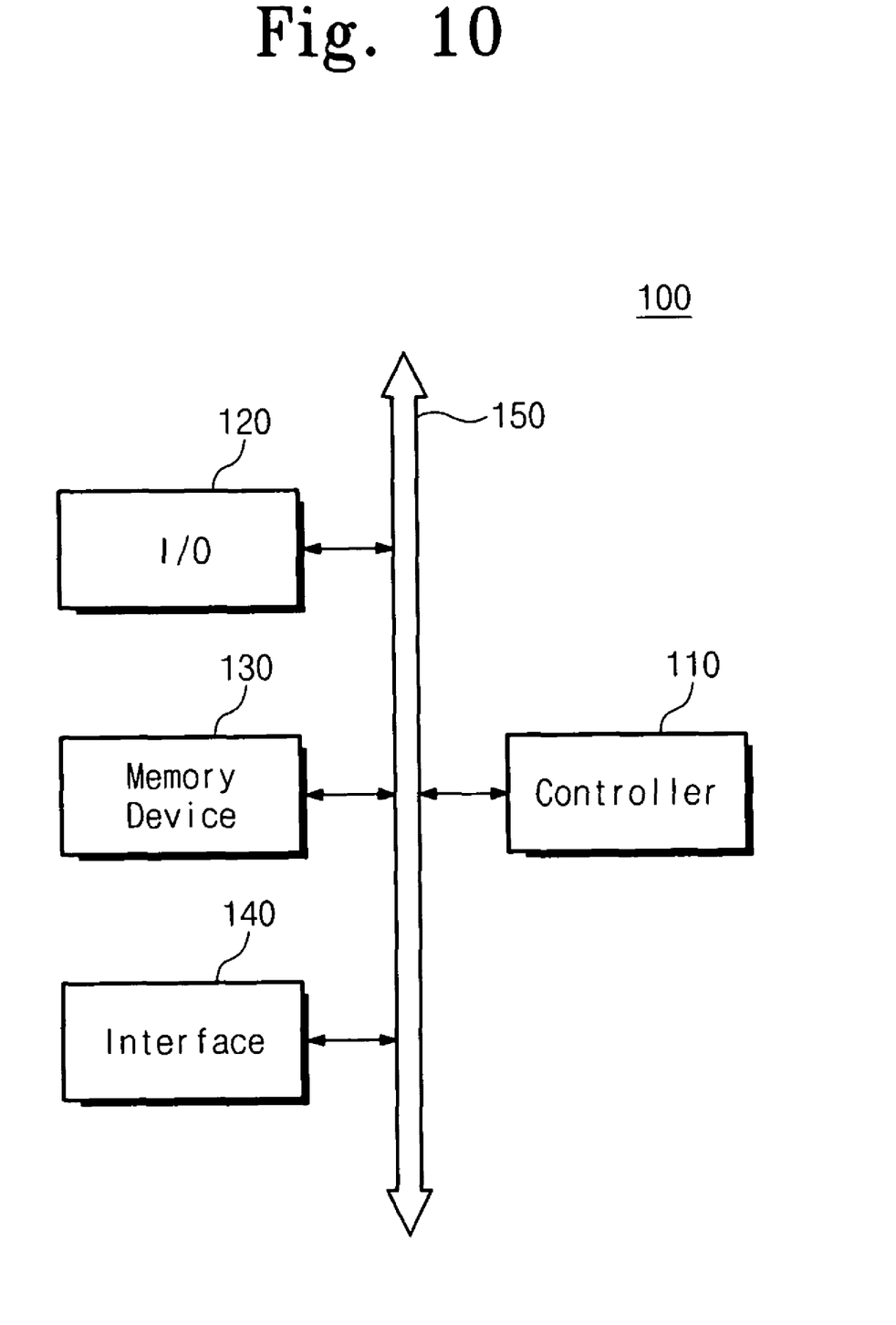
FIG. 10 is a block diagram illustrating an electronic system including the semiconductor package according to an embodiment of the inventive concept.

FIG. 10 is a block diagram illustrating an electronic system including the semiconductor package according to an embodiment of the inventive concept.

Referring to FIG. 10, an electronic system 100 according to an embodiment of the inventive concept may include a controller 110, an I/O device 120, a memory device 130, an interface 140, and a bus 150. The controller 110, the I/O device 120, the memory device 130, and/or the interface 140 may be connected to each other through the bus 150. The bus 150 serves as a path through which data are transmitted.

The controller 110 may include at least one of a microprocessor, a digital signal process, a micro controller, and logic devices executing a similar function thereof. The I/O device 120 may include a keypad, a keyboard, and a display device. The memory device 130 may store data and/or commands. The memory device 130 may include at least one of the semiconductor packages described in the above embodiments. Moreover, the memory device 130 may further include different kinds of semiconductor memory devices (for example, a phase change memory device, a magnetic memory device, a DRAM device, and/or an SRAM device). The interface 140 executes a function of transmitting or receiving data to or from a communication network. The interface 140 may be formed of a wired type or a wireless type. For example, the interface 140 may include an antenna or a wired and wireless transceiver. Even though not illustrated, the electronic system 100 may further include a high-speed DRAM and/or a high-speed SRAM as an operational memory for improving the operation of the controller 110.

The electronic system 100 may be applicable to a personal digital assistant (PDA), a portable computer, a web tablet, a wireless phone, a mobile phone, a digital music player, a memory card, or all electronic apparatuses capable of transmitting and/or receiving information in a wireless environment.

Figure 11:
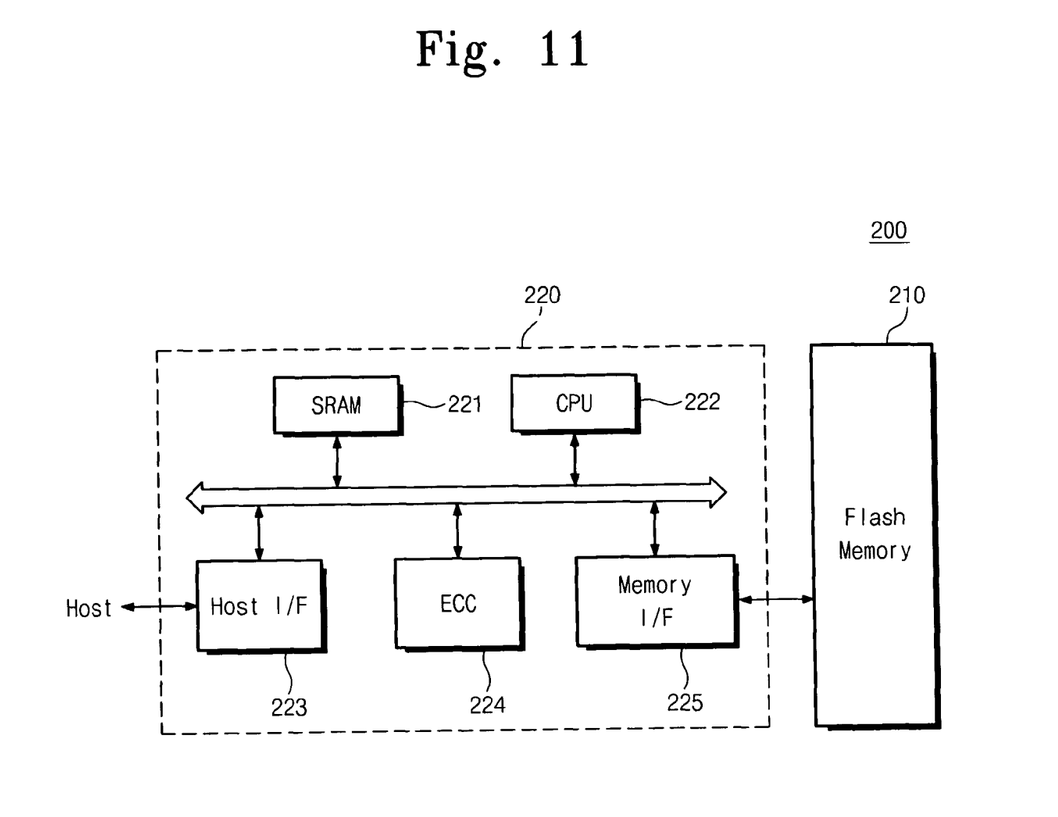
FIG. 11 is a block diagram illustrating a memory card including the semiconductor package according to an embodiment of the inventive concept.

FIG. 11 is a block diagram illustrating a memory card including the semiconductor package according to an embodiment of the inventive concept.

Referring to FIG. 11, a memory card 200 includes a memory device 210. The memory device 210 may include at least one of the semiconductor packages described in the above embodiments. The memory card 200 may include a memory controller 220 controlling data exchange between a host and the memory device 210.

The memory controller 220 may include a processing unit 222 controlling a general operation of the memory card. The memory controller 220 may include an SRAM 221 used as an operational memory of the processing unit 222. The memory controller 220 may further include a host interface 223 and a memory interface 225. The host interface 223 may include a protocol for exchanging data between the memory card 200 and the host. The memory interface 225 may connect the memory controller 220 to the memory device 210. The memory controller 220 may further include an error correction block (ECC) 224. The error correction block 224 may detect and correct errors of data read from the memory device 210. Even though not illustrated, the memory card 200 may further include a ROM device for storing code data for interfacing the host. The memory card 200 may be used as a portable data memory card. Alternatively, the memory card 200 may be realized as a solid state disk (SSD) capable of replacing a hard disk of a computer system.

According to the embodiments of the inventive concept, the plurality of semiconductor chips is mounted to have coplanarity, thereby realizing the high-capacity semiconductor package. This can prevent the thickness of the semiconductor package from being increased.

Moreover, since the inter-chip molding layer disposed between the semiconductor chips comes into contact with the upper molding layer and the slot molding layer, embodiments of the inventive concept may prevent the molding layers of the semiconductor package from being delaminated.

Furthermore, embodiments of the inventive concept may compensate signal skew occurring due to the length of the wire between the semiconductor chips by the circuit wirings which make electrical connection between the bonding pads.

The above-described subject matter is to be considered illustrative and not restrictive, and the appended claims are intended to cover all such modifications, enhancements, and other embodiments, which fall within the true spirit and scope of the inventive concept. Thus, to the maximize extent allowed by law, the scope of the inventive concept is to be determined by the broadest permissible interpretation of the following claims and their equivalents, and shall not be restricted or limited by the foregoing detailed description.

What is claimed is:

1. A semiconductor package comprising:
   a printed circuit board having a slot;
   a first semiconductor chip mounted on the printed circuit board to cover a first part of the slot; and
   a second semiconductor chip mounted on the printed circuit board to cover a second part of the slot separate from the first part,
   wherein the first semiconductor chip is substantially coplanar with the second semiconductor chip,
   wherein none of the semiconductor chips in the semiconductor package entirely cover the slot.

2. The semiconductor package of claim 1, wherein the first and second semiconductor chips are spaced apart from each other on the slot.

3. The semiconductor package of claim 1, further comprising:
   first wires, wherein
   the first and second semiconductor chips include bonding pads, where the bonding pads are provided on lower surfaces of the first and second semiconductor chips and are disposed so as to be exposed by the slot,
   the printed circuit board includes bond fingers disposed on a lower surface of the printed circuit board so as to be adjacent to the slot, and
   the first wires electrically connect the bonding pads to the bond fingers.

4. The semiconductor package of claim 3, wherein each of the first wires electrically connects one of the bonding pads of the first and second semiconductor chips to one of the bond fingers.

5. The semiconductor package of claim 3, wherein the first wires are disposed to pass through the slot.

6. The semiconductor package of claim 3, further comprising:
   second wires electrically connecting the bonding pads of the first semiconductor chip to the bonding pads of the second semiconductor chip.

7. The semiconductor package of claim 6, further comprising:
   solder balls attached under a surface of the printed circuit board opposite that to which the first and second semiconductor chips are adhered; and
   conductive wiring electrically connecting the bond fingers to the solder balls, wherein
   the first wires and the second wires transmit electric signals from the solder balls to the first and second semiconductor chips.

8. The semiconductor package of claim 7, wherein the solder balls include at least one of data input/output pins, an address pin, and a control pin.

9. The semiconductor package of claim 6, wherein each of the second wires electrically connects one of the bonding pads of the first semiconductor chip directly to one of the bonding pads of the second semiconductor chip.

10. The semiconductor package of claim 3, wherein the bonding pads include,
    first bonding pads electrically connecting the first semiconductor chip directly to the second semiconductor chip, and
    second bonding pads electrically connecting the printed circuit board to the first semiconductor chip and electrically connecting the printed circuit board to the second semiconductor chip.

11. The semiconductor package of claim 10, further comprising:
    pad wirings electrically connecting the first bonding pads to the second bonding pads.

12. The semiconductor package of claim 3, wherein at least one of the first and second semiconductor chips includes one or more circuit wires electrically connecting at least two of the bonding pads.

13. The semiconductor package of claim 1, further comprising:
    an upper molding layer covering the first semiconductor chip and the second semiconductor chip;
    a lower molding layer covering a lower surface of the printed circuit board;
    a slot molding layer interposed between the upper molding layer and the lower molding layer to fill the slot; and
    an inter-chip molding layer filling a space between the first semiconductor chip and the second semiconductor chip and in contact with the upper molding layer and the slot molding layer.

14. The semiconductor package of claim 13, wherein a length of the slot molding layer is longer than that of the inter-chip molding layer.

15. The semiconductor package of claim 14, wherein,
    the length of the slot molding layer is equal to that of the slot, and
    the length of the inter-chip molding layer is equal to that of at least one of the first and second semiconductor chips.

16. The semiconductor package of claim 13, wherein a length of the slot molding layer is shorter than that of the inter-chip molding layer.

17. The semiconductor package of claim 1, further comprising:
    a third semiconductor chip mounted on the first semiconductor chip; and
    a fourth semiconductor chip mounted on the second semiconductor chip.

18. The semiconductor package of claim 17, wherein,
    the third semiconductor chip and the fourth semiconductor chip cover a part of the slot, and
    a width between the third semiconductor chip and the fourth semiconductor chip is narrower than a width between the first semiconductor chip and the second semiconductor chip.

19. The semiconductor package of claim 1, wherein a part of the first semiconductor chip and a part of the second semiconductor chip are exposed through the slot.

* * * * *